(12) United States Patent
Ahn et al.

(10) Patent No.: US 10,630,422 B2
(45) Date of Patent: Apr. 21, 2020

(54) METHOD AND APPARATUS FOR CHANNEL ENCODING AN CHANNEL DECODING IN A WIRELESS COMMUNICATION SYSTEM

(71) Applicant: Samsung Electronics Co., Ltd., Suwon-si, Gyeonggi-do (KR)

(72) Inventors: Seok-Ki Ahn, Suwon-si (KR); Jae-Yoel Kim, Suwon-si (KR); Chi-Woo Lim, Suwon-si (KR); Min Jang, Seongnam-si (KR); Kwang-Taik Kim, Yongin-si (KR); Woo-Myoung Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 138 days.

(21) Appl. No.: 15/223,596

(22) Filed: Jul. 29, 2016

(65) Prior Publication Data
US 2017/0033894 A1  Feb. 2, 2017

(30) Foreign Application Priority Data

Jul. 30, 2015  (KR) ........................ 10-2015-0108267

(51) Int. Cl.
*H04L 1/00* (2006.01)
*H03M 13/11* (2006.01)
*H03M 13/15* (2006.01)
*H03M 13/13* (2006.01)

(52) U.S. Cl.
CPC ............ *H04L 1/0013* (2013.01); *H04L 1/005* (2013.01); *H04L 1/0016* (2013.01); *H04L 1/0066* (2013.01); *H03M 13/1102* (2013.01); *H03M 13/136* (2013.01); *H03M 13/152* (2013.01); *H04L 1/0055* (2013.01)

(58) Field of Classification Search
CPC ........................... H04L 1/1819; H04L 1/0013
See application file for complete search history.

(56) References Cited

U.S. PATENT DOCUMENTS

| 6,744,744 | B1 * | 6/2004 | Tong ..................... | H03M 13/00 370/320 |
| 7,590,920 | B2 * | 9/2009 | Yang ..................... | H03M 13/29 714/774 |
| 7,987,414 | B2 | 7/2011 | Kim et al. | |
| 2002/0022468 | A1 * | 2/2002 | Yoon ..................... | H03M 13/23 455/403 |
| 2003/0014715 | A1 * | 1/2003 | Lobinger .......... | H03M 13/2903 714/791 |

(Continued)

FOREIGN PATENT DOCUMENTS

KR   10-2009-0086730 A   8/2009

*Primary Examiner* — Steve N Nguyen
(74) *Attorney, Agent, or Firm* — Jefferson IP Law, LLP

(57) ABSTRACT

A method and apparatus for channel encoding and channel decoding in a wireless communication system are provided. The channel encoding method includes generating a first parity set and a second parity set based on information bits, determining a number of additional parity bits based on a number of the information bits and a required coding rate, generating the determined number of additional parity bits using the information bits, and generating a codeword including the information bits, the first parity set, the second parity set, and the generated additional parity bits.

6 Claims, 15 Drawing Sheets

(56) References Cited

U.S. PATENT DOCUMENTS

| | | | |
|---|---|---|---|
| 2004/0146029 A1* | 7/2004 | Tong | H03M 13/00 370/335 |
| 2007/0101232 A1* | 5/2007 | Kim | H03M 13/2957 714/755 |
| 2007/0136633 A1* | 6/2007 | Lee | H04L 1/0057 714/748 |
| 2008/0141104 A1* | 6/2008 | Miyazaki | H03M 13/2903 714/801 |
| 2009/0193312 A1 | 7/2009 | Lee et al. | |
| 2011/0119568 A1* | 5/2011 | Jeong | H03M 13/1185 714/790 |
| 2012/0089891 A1* | 4/2012 | Miyazaki | H03M 13/6356 714/790 |
| 2012/0226956 A1 | 9/2012 | Myung et al. | |
| 2012/0320951 A1* | 12/2012 | Han | H04L 1/0041 375/141 |
| 2013/0139025 A1 | 5/2013 | Gioulekas et al. | |
| 2014/0337682 A1 | 11/2014 | Prodan | |

* cited by examiner

| CQI INDEX | MODULATION SCHEME | EFFECTIVE CODING RATE | NUMBER OF TRANSMISSION BITS PER RE |
|---|---|---|---|
| 1 | QPSK | 0.076 | 0.152 |
| 2 | QPSK | 0.117 | 0.234 |
| 3 | QPSK | 0.188 | 0.377 |
| 4 | QPSK | 0.301 | 0.602 |
| 5 | QPSK | 0.438 | 0.877 |
| 6 | QPSK | 0.588 | 1.176 |
| 7 | 16QAM | 0.369 | 1.477 |
| 8 | 16QAM | 0.479 | 1.914 |
| 9 | 16QAM | 0.602 | 2.406 |
| 10 | 64QAM | 0.455 | 2.730 |
| 11 | 64QAM | 0.554 | 3.322 |
| 12 | 64QAM | 0.650 | 3.902 |
| 13 | 64QAM | 0.754 | 4.523 |
| 14 | 64QAM | 0.853 | 5.115 |
| 15 | 64QAM | 0.926 | 5.555 |

Rows 1–4 are grouped as 201.

FIG.2

| UL MCS INDEX | MODULATION SCHEME | EFFECTIVE CODING RATE | REPETITON FACTOR |
|---|---|---|---|
| 1 | π/2-BPSK | 1/3 | 16 |
| 2 | π/2-BPSK | 1/3 | 8 |
| 3 | π/2-BPSK | 1/3 | 4 |
| 4 | π/2-BPSK | 1/3 | 3 |
| 5 | π/2-BPSK | 1/3 | 2 |
| 6 | π/4-QPSK | 1/3 | 1 |
| 7 | π/4-QPSK | 2/3 | 1 |
| 8 | π/4-QPSK | 2/3 | 1 |
| 9 | π/4-QPSK | 2/3 | 1 |
| 10 | π/4-QPSK | 2/3 | 1 |
| 11 | π/8-8PSK | 2/3 | 1 |

Rows 1–6 are grouped as 301.

FIG.3

METHOD AND APPARATUS FOR CHANNEL ENCODING AN CHANNEL DECODING IN A WIRELESS COMMUNICATION SYSTEM

CROSS-REFERENCE TO RELATED APPLICATION(S)

This application claims the benefit under 35 U.S.C. § 119(a) of a Korean patent application filed on Jul. 30, 2015 in the Korean Intellectual Property Office and assigned Serial number 10-2015-0108267, the entire disclosure of which is hereby incorporated by reference.

TECHNICAL FIELD

The present disclosure relates to a method and apparatus for channel encoding and channel decoding in a wireless communication system.

BACKGROUND

In order to satisfy demands for wireless data traffic which have been increasing since commercialization of a $4^{th}$ generation (4G) communication system, efforts have been made to develop an advanced $5^{th}$ generation (5G) or a pre-5G communication system. Therefore, the 5G communication system or the pre-5G communication system is called a beyond 4G network communication system or a post long term evolution (LTE) system.

To achieve high data rates, implementation of the 5G communication system in an ultra-high frequency band (for example, a 60-GHz band) is considered. Beamforming, massive multiple input multiple output (MIMO), full dimensional MIMO (FD-MIMO), array antenna, analog beamforming, and massive antenna techniques are under discussion for the 5G communication system to mitigate the path loss of waves and increase the propagation distance of waves in the ultra-high frequency band.

For network improvement, technologies such as evolved small cell, advanced small cell, cloud radio access network (cloud RAN), ultra dense network, device to device communication (D2D), wireless backhaul, mobile network, cooperative communication, coordinated multi-point (CoMP), and received interference cancellation have been developed for the 5G communication system.

Besides, advanced coding modulation (ACM) such as hybrid modulation of frequency shift keying (FSK) and quadrature amplitude modulation (QAM) frequency and quadrature amplitude modulation (FQAM) and sliding window superposition coding (SWSC), and advanced access techniques such as filter bank multi-carrier (FBMC), non-orthogonal multiple access (NOMA), and sparse code multiple access (SCMA) are under development for the 5G communication system.

Meanwhile, a cellular wireless communication system performs channel encoding using many types of channel codes. A major channel code used for channel encoding is a turbo code with a coding rate of ⅓. A coding rate of k/n means, for example, that for each k information bits, n total bits are generated for transmission, of which n-k bits are redundant. Many cellular wireless communication systems use the turbo code.

A cellular communication system may require a different coding rate according to a communication environment. If the required coding rate is ⅓ or higher, puncturing is applied to the rate ⅓ turbo code. On the contrary, if the required coding rate is ⅓ or lower, generated turbo codewords are repeated and then transmitted. This scheme is called "repetition transmission". Channel encoding using the rate ⅓ turbo code has been adopted in a $3^{rd}$ generation (3G) or 4G communication system, and is considered as a candidate for channel encoding in cellular Internet of things (CIoT) under standardization.

Since channel encoding is generally based on the rate ⅓ turbo code, if a required coding rate is ⅓ or lower, a necessary parity is generated by "repetition" of generated turbo codewords. According to the repetition transmission scheme, as a required coding rate decreases, a receiver decodes a received signal by combining bits repeatedly transmitted by a transmitter, thereby achieving a power gain. However, the power gain is smaller than a coding gain achievable by generation of low-rate codewords. That is, the repetition transmission scheme does not achieve a coding gain achievable at a decreased coding rate. This serves as a factor of system performance degradation in 3G/4G communication or CIoT requiring a coding rate equal to or lower than ⅓.

The above information is presented as background information only to assist with an understanding of the present disclosure. No determination has been made, and no assertion is made, as to whether any of the above might be applicable as prior art with regard to the present disclosure.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and apparatus for channel encoding and channel decoding in a wireless communication system.

Another aspect of the present disclosure is to provide a channel encoding method and apparatus for generating additional parity bits according to a required coding rate, and a channel decoding method and apparatus being the counterpart of the channel encoding method and apparatus, in a wireless communication system.

Another aspect of the present disclosure is to provide a method and apparatus for determining the number and positions of information bits or codeword bits for use in generating additional parity bits used for channel encoding in a wireless communication system.

Another aspect of the present disclosure is to provide a method and apparatus for supporting channel encoding and channel decoding in an area of a coding rate equal to or lower than a predetermined coding rate in an encoder and decoder based on the predetermined coding rate in a wireless communication system.

Another aspect of the present disclosure is to provide a decoding scheduling method and apparatus for increasing a decoding speed during channel decoding in a wireless communication system.

In accordance with an aspect of the present disclosure, a channel encoding method in a wireless communication system is provided. The channel encoding method includes generating a first parity set and a second parity set based on information bits, determining a number of additional parity bits based on a number of the information bits and a required coding rate, generating the determined number of additional parity bits using the information bits, and generating a codeword including the information bits, the first parity set, the second parity set, and the generated additional parity bits.

In accordance with another aspect of the present disclosure, a channel encoding method in a wireless communication system is provided. The channel encoding method includes generating a first codeword including information bits, a first parity set, and a second parity set, the first and second parity sets being generated based on the information bits, determining a number of additional parity bits based on a number of bits of the first codeword and a required coding rate, generating the determined number of additional parity bits using the bits of the first codeword, and generating a second codeword including the bits of the first codeword and the generated additional parity bits.

In accordance with another aspect of the present disclosure, a channel decoding method in a wireless communication system is provided. The channel decoding method includes primarily decoding information bits based on the information bits, a first parity set, and a second parity set included in a codeword, and secondarily decoding additional parity bits using the additional parity bits included in the codeword, and a result of the primary decoding. A result of the secondary decoding is used as an input for decoding of the information bits during the primary decoding.

In accordance with another aspect of the present disclosure, a channel encoder in a wireless communication system is provided. The channel encoder includes a first encoder for configured to generate a first parity set and a second parity set based on information bits, an additional parity bit generator configured to determine a number of additional parity bits based on a number of the information bits and a required coding rate, and generate the determined number of additional parity bits using the information bits, and a codeword generator configured to generate a codeword including the information bits, the first parity set, the second parity set, and the generated additional parity bits.

In accordance with another aspect of the present disclosure, a channel encoder in a wireless communication system is provided. The channel encoder includes a first encoder configured to generate a first codeword including information bits, a first parity set, and a second parity set, the first and second parity sets being generated based on the information bits, an additional parity bit generator configured to determine a number of additional parity bits based on a number of bits of the first codeword and a required coding rate, and generate the determined number of additional parity bits using the bits of the first codeword, and a codeword generator configured to generate a second codeword including the bits of the first codeword and the generated additional parity bits.

In accordance with another aspect of the present disclosure, a channel decoder in a wireless communication system is provided. The channel decoder includes a first decoder configured to primarily decode information bits based on the information bits, a first parity set, and a second parity set included in a codeword, and a second decoder configured to secondarily decode additional parity bits using the additional parity bits included in the codeword, and a result of the primary decoding. The first decoder is further configured to use a result of the secondary decoding as an input for decoding of the information bits.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 2 is a view illustrating a modulation and coding scheme (MCS) table that a user equipment (UE) feeds back to an evolved node B (eNB) in along term evolution (LTE) communication system according to an embodiment of the present disclosure;

FIG. 3 is a view illustrating an MCS table considered for a cellular Internet of things (CIoT) communication system under standardization according to an embodiment of the present disclosure;

Throughout the drawings, like reference numerals will be understood to refer to like parts, components, and structures.

DETAILED DESCRIPTION

Figure 1:
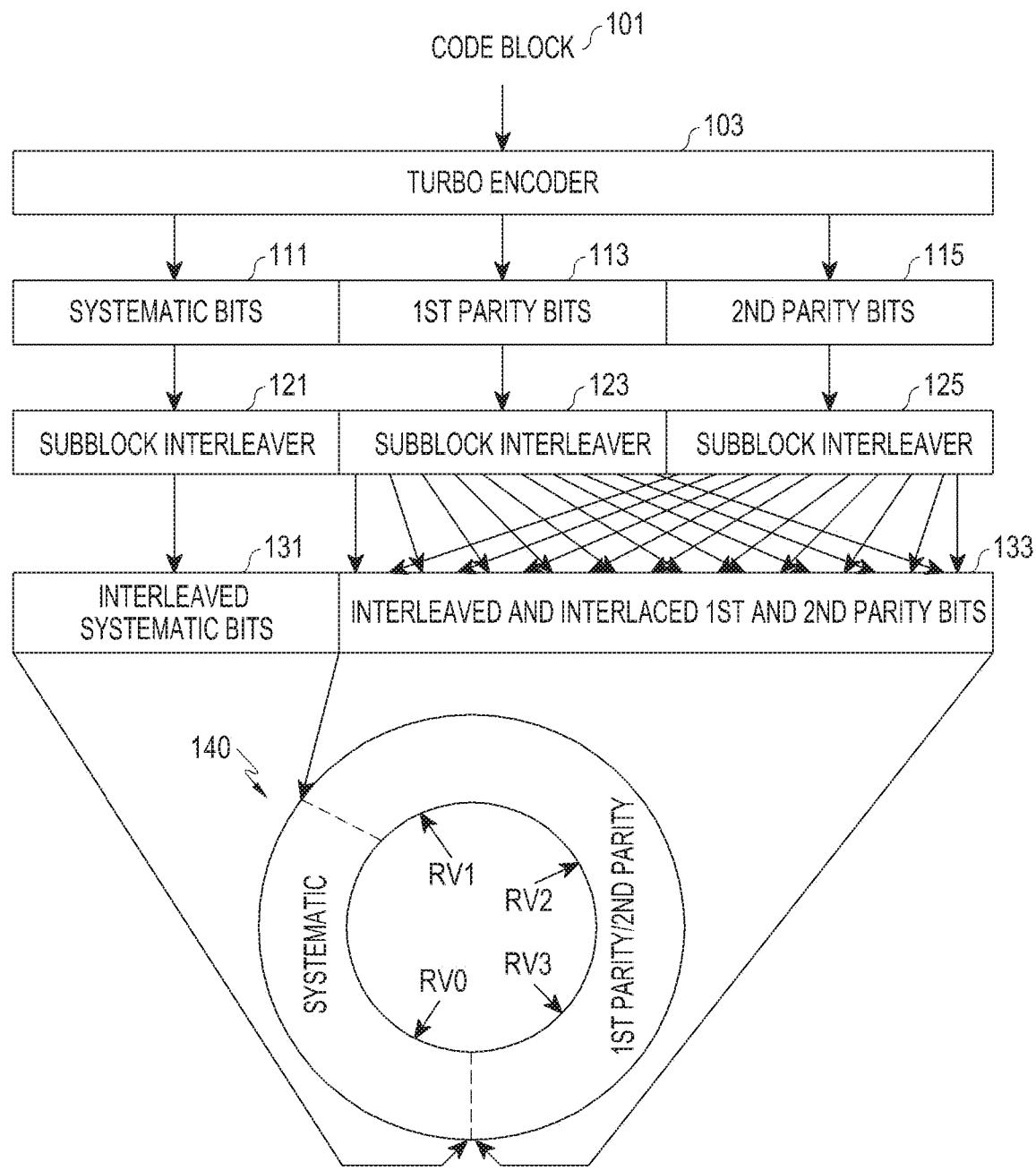
FIG. 1 is a view illustrating a method for supporting various coding rates in a general turbo encoder according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Lest it should obscure the subject matter of the present disclosure, a detailed description of known functions or structures will be omitted. Hereinbelow, specific embodiments of the present disclosure will be described in detail with reference to the attached drawings.

While the various embodiments of the present disclosure are described as separate ones for the convenience of description, two or more of them can be implemented in combination as far as the combination does not cause conflict.

The terms used in the following description are defined in consideration of their functions in the present disclosure and may vary according to the intent of a user or an operator or the customs. Therefore, the present disclosure should be defined by the appended claims and their equivalents.

Many modifications can be made to various embodiments of the present disclosure. Specific embodiments of the present disclosure will be described in detail with reference to the accompanying drawings. However, the scope of the present disclosure is not intended to be limited to the particular embodiments and it is to be understood that the present disclosure covers all modifications, equivalents, and/or alternatives falling within the scope and spirit of the present disclosure.

Ordinal terms as used in the present disclosure, such as first and second may modify the names of various components, not being intended to limit the components. These expressions are used to distinguish one component from another component. For example, a component may be referred to as a second component and vice versa without departing from the scope of the present disclosure. The term, and/or includes a combination or any of a plurality of related items.

In the present disclosure, the term 'have', 'may have', 'include', or 'may include' signifies the presence of a feature, number, operation, component, part, or a combination of them, not excluding the presence or possible addition of one or more other features, numbers, operations, components, parts, or a combination of them.

Apparatuses and methods proposed by the present disclosure are applicable to various communication systems including a long term evolution (LTE) mobile communication system, an LTE-advanced (LTE-A) mobile communication system, a high speed downlink packet access (HS-DPA) mobile communication system, a high speed uplink packet access (HSUPA) mobile communication system, a 3rd generation project partnership 2 (3GPP2) high rate packet data (HRPD) mobile communication system, a 3GPP2 wideband code division multiple access (WCDMA) mobile communication system, a 3GPP2 CDMA mobile communication system, an institute of electrical and electronics engineers (IEEE) 802.16m communication system, an evolved packet system (EPS), and a mobile Internet protocol (mobile IP) system.

Before describing the present disclosure, a turbo encoder will be described in brief.

FIG. 1 is a view illustrating a method for supporting various coding rates in a general turbo encoder according to an embodiment of the present disclosure.

Referring to FIG. 1, a turbo encoder 103 receives a code block 101 and outputs systematic bits 111, first parity bits 113, and second parity bits 115. Block (or subblock) interleavers 121, 123, and 125 interleave the systematic bits 111, the first parity bits 113, and the second parity bits 115 received from the turbo encoder 103. Interleaved systematic bits 131, and interleaved and interlaced first and second parity bits 133 are stored at predetermined positions in a buffer 140. A transmitter transmits as many bits as needed out of the bits stored in the buffer 140 according to a required coding rate. If the required coding rate is ⅓ or lower, necessary parity bits may be transmitted by repeatedly outputting a codeword stored in the buffer 140.

FIG. 2 is a view illustrating a modulation and coding scheme (MCS) table that a user equipment (UE) feeds back to an evolved node B (eNB) in an LTE communication system according to an embodiment of the present disclosure.

Referring to FIG. 2, channel encoding at or below an effective coding rate of ⅓ is required for channel quality indicator (CQI) indexes 1 to 4 indicated by reference numeral 201.

FIG. 3 is a view illustrating an MCS table considered for a cellular Internet of things (CIoT) communication system under standardization according to an embodiment of the present disclosure.

Referring to FIG. 3, channel encoding at or below an effective coding rate of ⅓ is required for MCS indexes 1 to 6 indicated by reference numeral 301. As described above, channel encoding is performed at a coding rate of ⅓ or lower in many cases in cellular communication.

The present disclosure proposes a method for more efficiently performing channel encoding, when channel encoding is performed at a coding rate equal to or lower than a predetermined value (for example, ⅓).

Before a detailed description of the present disclosure, the basic concept of the present disclosure will be described in brief.

In various embodiments of the present disclosure, a codeword is generated by generating additional parity bits and including the parity bits in the codeword. In regard to inclusion of additional parity bits in a codeword, additional parity bits may be added in parallel to a codeword generated from a conventional encoder (first embodiment), or additional parity bits may be added serially to a codeword generated from a conventional encoder (second embodiment). Further, channel decoding methods and apparatuses corresponding to the channel encoding methods are proposed.

Meanwhile, since a decoder for decoding a codeword generated from a conventional encoder and a decoder for decoding additional parity bits are co-existent for channel decoding of the present disclosure, decoding scheduling is performed to control the decoding numbers of the two decoders, to thereby increase a decoding speed.

Encoders according to various embodiments of the present disclosure will be described as based on a conventional turbo encoder. Therefore, a conventional operation of a rate ⅓ turbo encoder is still performed, and as many additional parity bits as needed are generated according to a required coding rate. However, the various embodiments of the present disclosure are not limited to a turbo encoder.

Figure 4:
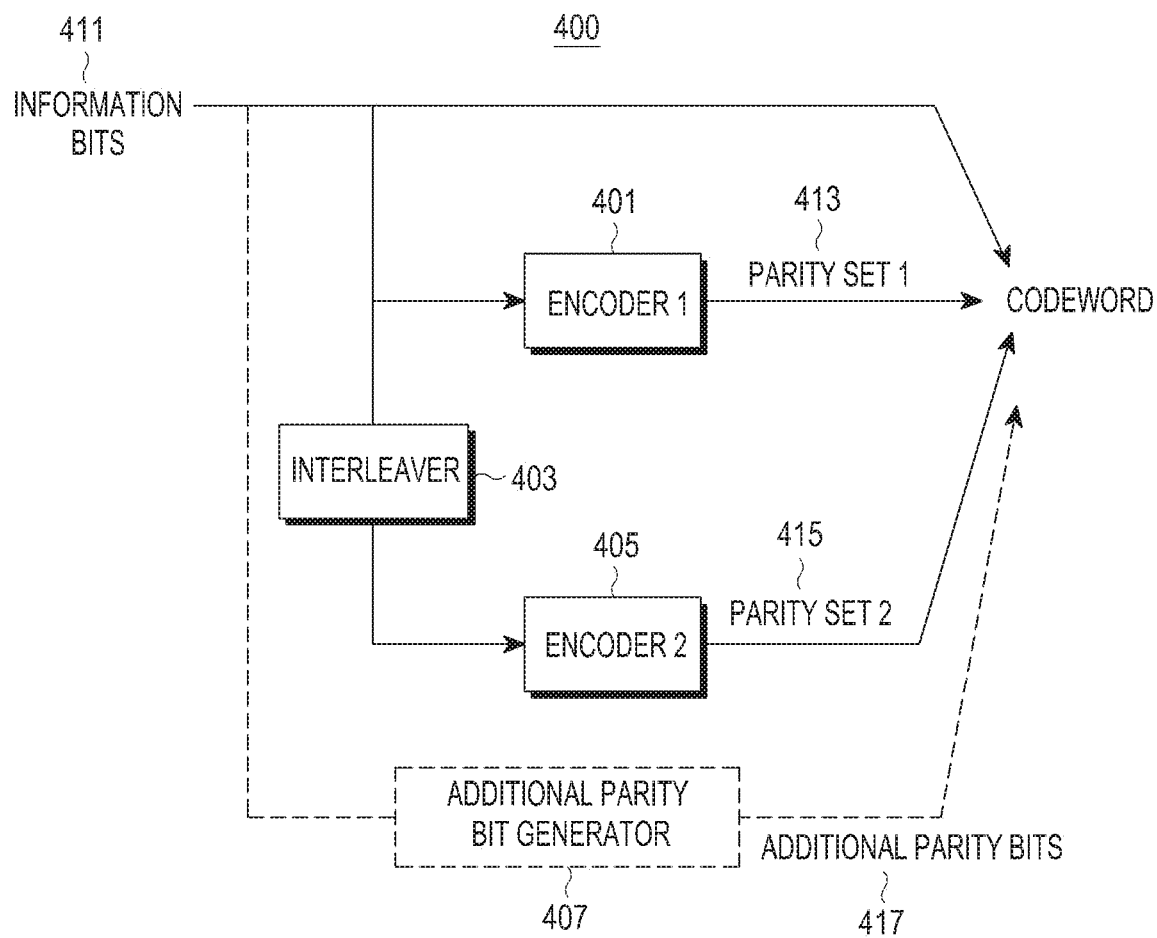
FIG. 4 is a view illustrating the structure of a turbo encoder according to an embodiment of the present disclosure.
Figure 5:
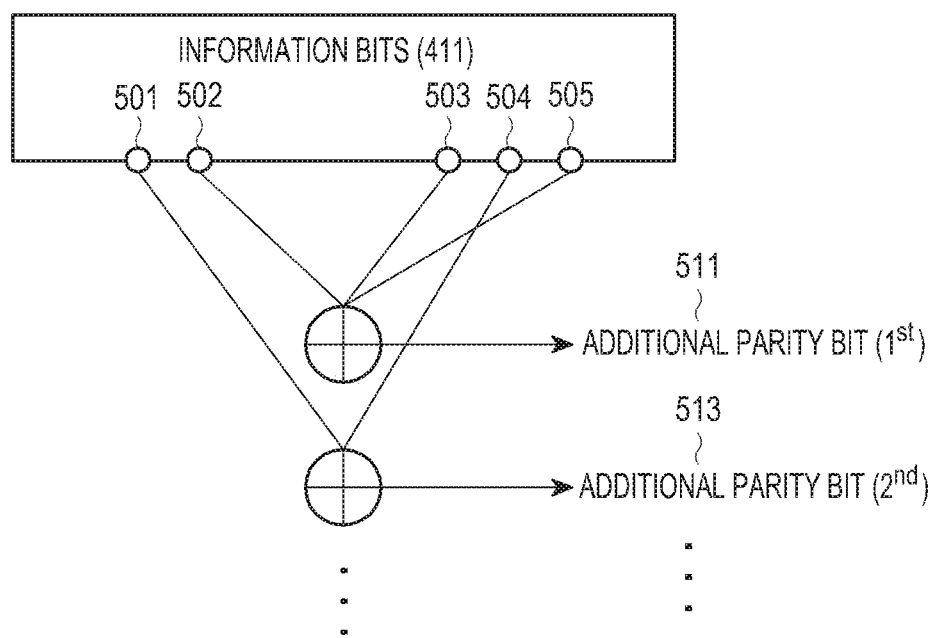
FIG. 5 is a view illustrating a method for generating additional parity bits in an additional parity bit generator according to the embodiment of the present disclosure illustrated in FIG. 4.
Figure 6:
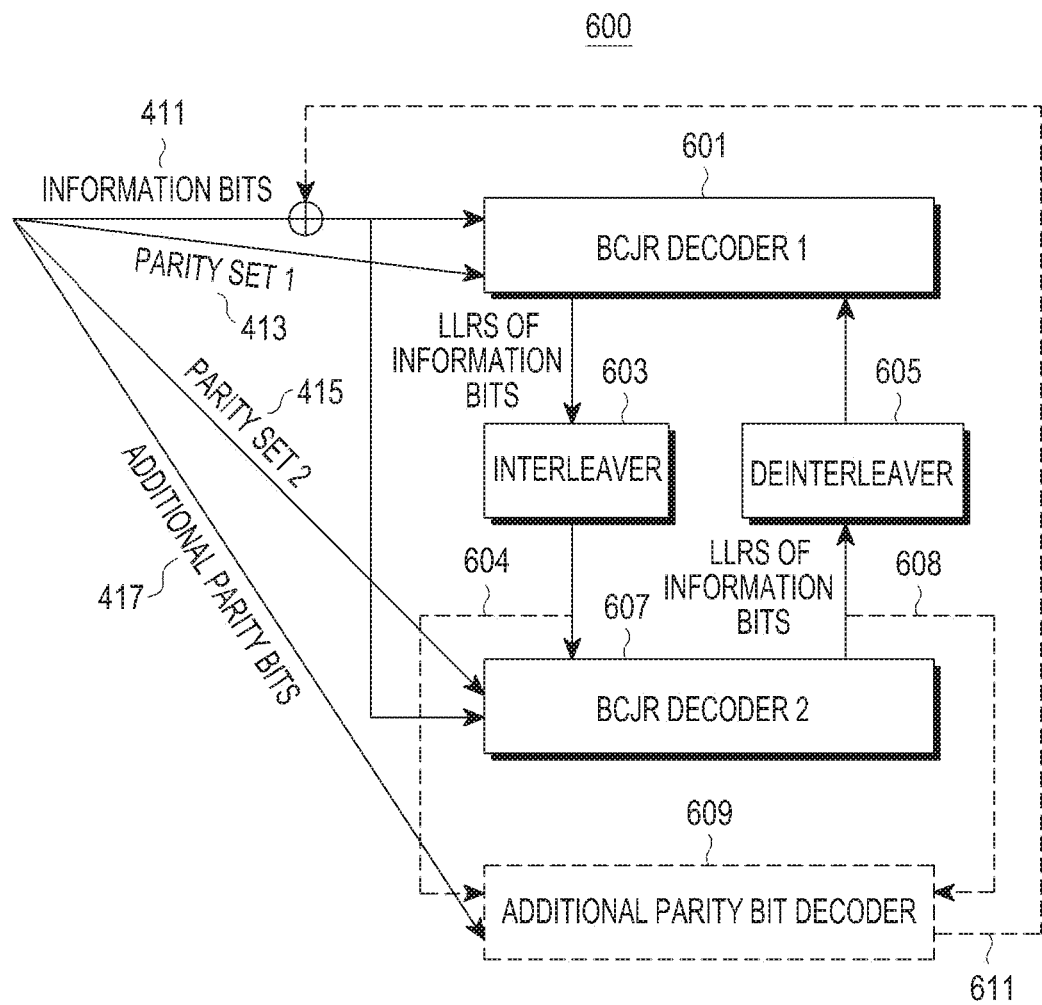
FIG. 6 is a view illustrating the structure of a turbo decoder according to an embodiment of the present disclosure.

With reference to FIGS. 4, 5, and 6, an encoding and decoding method according to an embodiment of the present disclosure will be described below.

FIG. 4 is a view illustrating the structure of a turbo encoder according to an embodiment of the present disclosure.

Referring to FIG. 4, a turbo encoder 400 includes a first turbo encoder (turbo encoder 1) 401, an interleaver 403, and a second encoder (encoder 2) 405. The turbo encoder 400 further includes an additional parity bit generator 407. The first turbo encoder 401, the interleaver 403, and the second encoder 405 are the components of the general turbo encoder, and the additional parity bit generator 407 is added to the general turbo encoder according to the present disclosure. In the embodiment, the additional parity generator 407 is connected in parallel to the first turbo encoder 401, the interleaver 403, and the second encoder 405. The additional parity bit generator 407 generates one or more additional parity bits. The number of the generated additional parity bits is determined based on the number of information bits and a required coding rate.

Meanwhile, it is assumed that the additional parity bit generator 407 uses, for example, a single parity check code in the present disclosure. That is, the additional parity bit generator 407 may generate additional parity bits using the single parity check code. The additional parity bit generator 407 may generate one additional parity bit by exclusive or (XOR-operating a predetermined number of (for example, two or three) information bits. The additional parity bits generated in this manner and a turbo codeword encoded at a coding rate of ⅓ are constructed into a final codeword and transmitted, thus satisfying the required coding rate. While not shown, a codeword generator may generate the turbo codeword and the additional parity bits. Since as many additional parity bits as needed may be generated continuously in the proposed method of the present disclosure, all possible numbers of information bits and all possible required coding rates may be satisfied.

A codeword generated from the turbo encoder 400 illustrated in FIG. 4 includes one or more additional parity bits as well as information bits 411, a first parity set (parity set 1) 413, and a second parity set (parity set 2) 415.

Meanwhile, an issue to be considered for the additional parity generation operation is to determine the number and positions of information bits to be XOR-operated. Because the number and positions of information bits significantly affect encoding performance, the number and positions of information bits should be optimized in terms of performance. In general, channel encoding at a low coding rate operates in a low signal-to-noise ratio (SNR) area, and it is preferred in terms of performance to generate an additional parity bit from a small number of information bits. That's why the present disclosure uses a specific small number of (for example, two or three) information bits in XOR operation. Meanwhile, as a required coding rate decreases, the number of information bits needed for XOR operation tends to decrease.

FIG. 5 is a view illustrating a method for generating additional parity bits in the additional parity bit generator 407 according to the embodiment of the present disclosure illustrated in FIG. 4.

As described before with reference to FIG. 4, an additional parity bit is generated by XOR-operating a small number of (two or three) information bits. The positions of information bits used in generating an additional parity bit are different according to the turn of the additional parity bit. For example, referring to FIG. 5, a first parity bit (parity bit 1) 511 is generated by XOR-operating three information bits 502, 503, and 505, and a second parity bit (parity bit 2) 513 is generated by XOR-operating two information bits 501 and 504. The operation for generating additional parity bits, illustrated in FIG. 5 continues until all of the necessary additional parity bits are generated.

FIG. 6 is a view illustrating the structure of a turbo decoder according to an embodiment of the present disclosure.

Referring to FIG. 6, a turbo decoder 600 includes a first Bahl, Cocke, Jelinek and Raviv (BCJR) decoder (BCJR decoder 1) 601, an interleaver 603, a deinterleaver 605, a second BCJR decoder (BCJR decoder 2) 607, and an additional parity bit decoder 609. The first BCJR decoder 601, the interleaver 603, the deinterleaver 605, and the second BCJR decoder 607 are the components of a general turbo decoder, and the additional parity bit decoder 609 is added to the general turbo decoder according to the present disclosure.

The additional parity bit decoder 609 processes additional parity bits generated from the turbo decoder 400 of FIG. 4. That is, the additional parity bit decoder 609 is used to increase the decoding performance of a turbo codeword by generating specific information from the additional parity bits. Specifically, the additional parity bit decoder 609 receives the additional parity bits 417, and log-likelihood ratio (LLR) values 604 and 608 of information bits exchanged between the BCJR decoders 601 and 607, and outputs specific information 611 for the information bits, using the inputs. The specific information 611 is added to the LLR values of the information bits input to the turbo decoder 600. The turbo decoder 600 of the present disclosure performs turbo decoding using LLR values in which the values output from the additional parity bit decoder 609 are reflected. This operation is repeated at each iterative decoding of a turbo code.

A description will be given of an encoding and decoding method according to another embodiment of the present disclosure with reference to FIGS. 7, 8 and 9.

Figure 7:
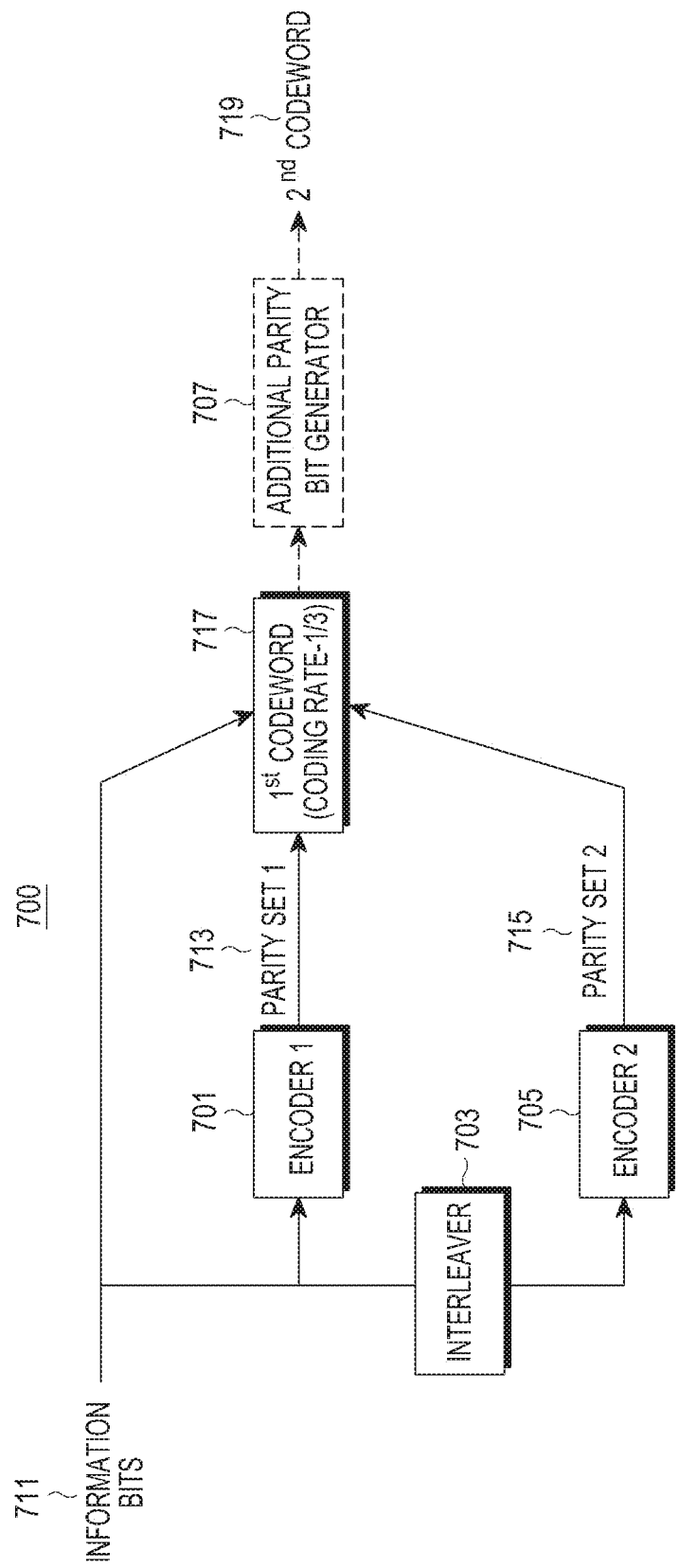
FIG. 7 is a view illustrating the structure of a turbo encoder according to an embodiment of the present disclosure.

FIG. 7 is a view illustrating the structure of a turbo encoder according to an embodiment of the present disclosure.

The encoder 400 of FIG. 4 generates additional parity bits using only information bits, in the state where the additional parity bit generator 407 is connected to the other components 401, 403, and 405 in parallel. In contrast, an additional parity bit generator 707 is connected serially to the other components 701, 703, and 705 in an encoder 700 of FIG. 7. Therefore, additional parity bits are generated using the bits of a first codeword generated at a coding rate of ⅓ by the other components 701, 703, and 705. That is, the encoder 700 of FIG. 7 is different from the encoder 400 of FIG. 4 in that additional parity bits are generated using information bits, and parity bits included in parity set 1 and/or parity set 2.

Referring to FIG. 7, the turbo encoder 700 includes a first encoder (encoder 1) 701, an interleaver 703, a second encoder (encoder 2) 705, and a serially connected additional parity bit generator 707. The turbo encoder 700 generates a first codeword 717 including information bits and parity bits included in a first parity set (parity set 1) 713 and/or a second parity set (parity set 2) 715, generates additional parity bits using the first codeword 717 through the additional parity bit generator 707, and generates a second codeword 719 as a final codeword by adding the additional parity bits to the first codeword 717. However, a codeword generator (not shown) may be provided as a separate component for generating the second codeword.

Figure 8:
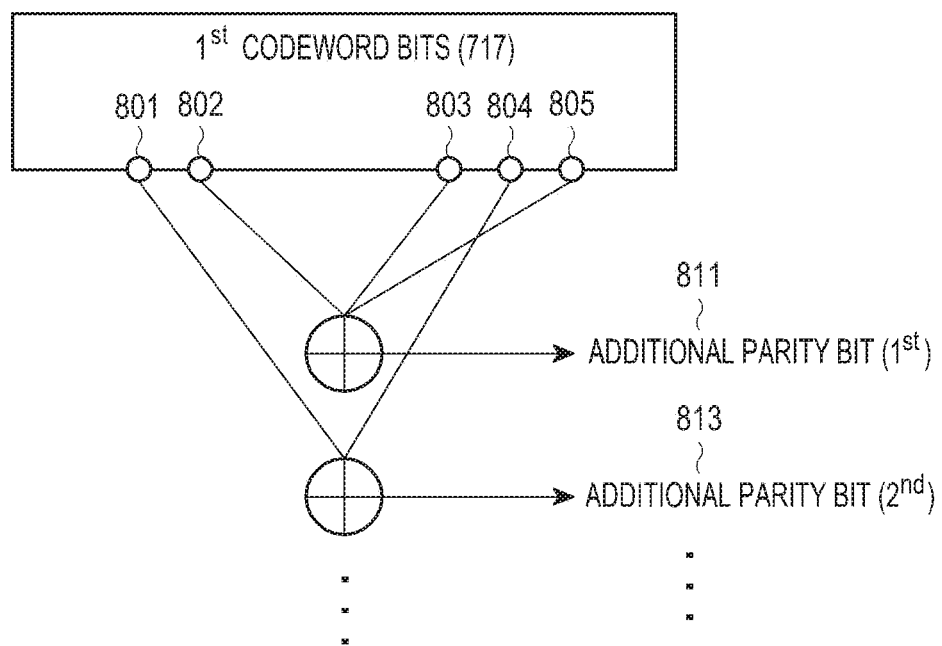
FIG. 8 is a view illustrating a method for generating additional parity bits in an additional parity bit generator according to the second embodiment of the present disclosure illustrated in FIG. 7.

FIG. 8 is a view illustrating a method for generating additional parity bits in the additional parity bit generator 707 according to the second embodiment of the present disclosure illustrated in FIG. 7.

Referring to FIG. 8, additional parity bits 811 and 813 are generated using the bits of the first codeword 717, which is different from FIG. 5 in which the additional parity bits 511 and 513 are generated using the information bits 411. That is, additional parity bits are generated by XOR-operating information bits and the bits of a turbo codeword encoded at a coding rate of ⅓ in FIG. 8. The positions of information bits used in generating an additional parity bit may vary according to the turn of the additional parity bit. For example, referring to FIG. 8, a first parity bit (parity bit 1) 811 is generated by XOR-operating three information bits 802, 803, and 805, and a second parity bit (parity bit 2) 813 is generated by XOR-operating two information bits 801 and 804. The operation for generating additional parity bits, illustrated in FIG. 8 continues until all of necessary additional parity bits are generated.

Figure 9:
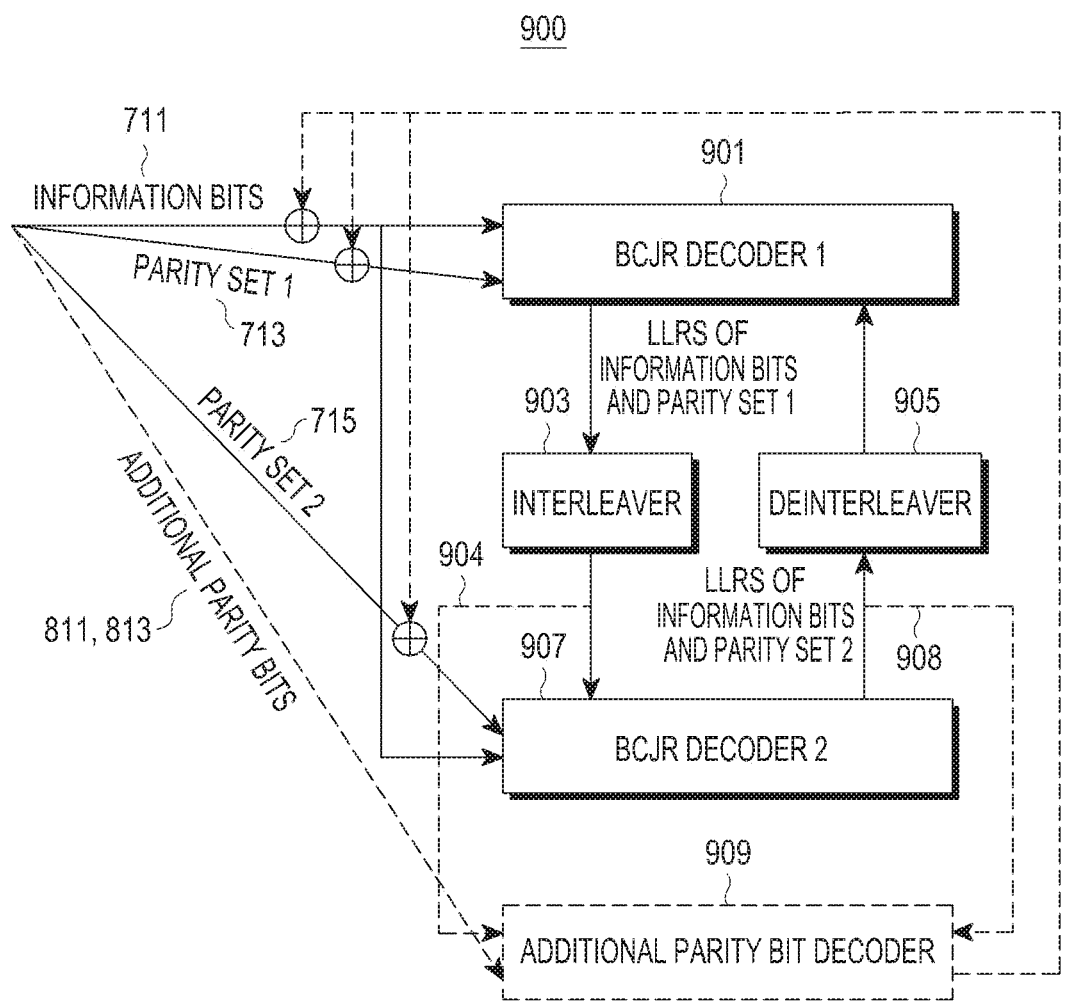
FIG. 9 is a view illustrating the structure of a turbo decoder according to the second embodiment of the present disclosure.

FIG. 9 is a view illustrating the structure of a turbo decoder according to the second embodiment of the present disclosure.

A turbo decoder 900 of FIG. 9 basically has the same configuration as and operates in the same manner as the turbo decoder 600 described with reference to FIG. 6. That is, referring to FIG. 9, the turbo decoder 900 includes a first BCJR decoder (BCJR decoder 1) 901, an interleaver 903, a deinterleaver 905, a second BCJR decoder (BCJR decoder 2) 907, and an additional parity bit decoder 909.

However, since the information bits 711 and the parity bit sets 713 and 715 are used for generating additional parity bits in the encoder 700 according to the second embodiment, the LLR values of parity bits included in the first parity set 713 and/or the second parity set 715 as well as the LLR values of the information bits 717 are needed as inputs to the additional parity decoder 909. Referring to FIG. 9, reference numeral 904 denotes "LLR values of information bits and parity set 1," and reference numeral 908 denotes "LLR values of information bits and parity set 2."

Meanwhile, the additional parity decoder 909 generates specific information for the information bits 711, the parity bits of the first parity set 713, and the parity bits of the second parity set 715 from the input information, and adds the generated specific information to the LLR values input to the turbo decoder 700.

Meanwhile, the BCJR decoders 901 and 907 of the turbo decoder 900 exchange only the LLR values of the information bits. Accordingly, to operate the turbo decoder 900 of FIG. 9, the BCJR decoders 901 and 907 should calculate the LLR values of the parity bits of the first parity set 713 and the LLR values of the parity bits of the second parity set 715. To allow the BCJR decoders 901 and 907 to operate in this manner, the structure of a conventional turbo decoder needs to be modified.

Now, an operation of an additional parity bit decoder according to various embodiments of the present disclosure will be described.

Figure 10:
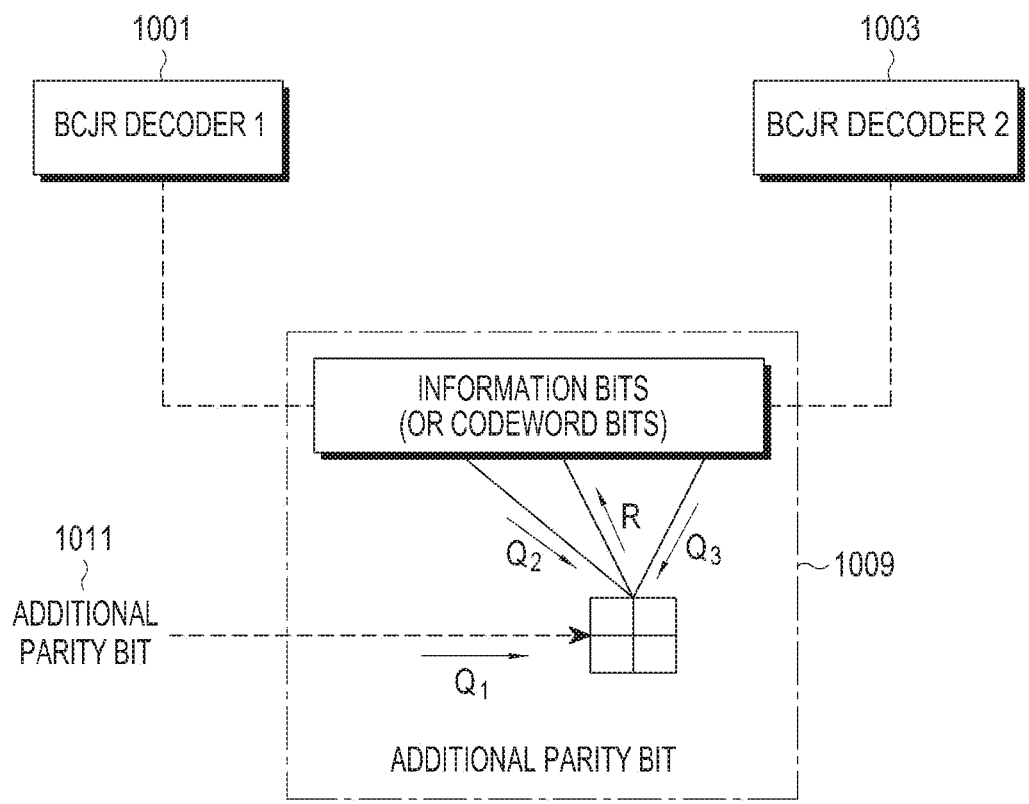
FIG. 10 is a view illustrating a detailed operation of an additional parity bit decoder according to an embodiment of the present disclosure.

FIG. 10 is a view illustrating a detailed operation of an additional parity bit decoder 1009 according to an embodiment of the present disclosure.

Referring to FIG. 10, the additional parity bit decoder 1009 may correspond to the additional parity bit decoder 609 illustrated in FIG. 6, and the additional parity bit decoder 909 illustrated in FIG. 9.

In the foregoing first embodiment, the additional parity bit decoder 1009 decodes an additional parity bit 1011 generated by XOR-operating a predetermined number of (two or three) information bits. In the foregoing second embodiment, the additional parity bit decoder 1009 decodes an additional parity bit 1011 generated by XOR-operating a predetermined number of (two or three) codeword bits. The decoding operation is similar to an operation of a check node for a low density parity check (LDPC) code.

Information R output from the additional parity bit decoder 1009 may be calculated using input information $Q_1$, $Q_2$, and $Q_3$ by Equation 1.

$$R = \varphi(\varphi(Q_1) + \varphi(Q_2) + \varphi(Q_3)) \qquad \text{Equation 1}$$

where the function $\varphi(x)$ is given as $\varphi(x) = -0.5 \log(\tanh(0.5x))$ and may be implemented in the form of a look-up table.

Further, inputs to the additional parity bit decoder 1009 include the values of additional parity bits received at the turbo decoder, and signals output from BCJR decoders 1001 and 1003. In the first embodiment, the signals output from the BCJR decoders 1001 and 1003 are the LLR values of information bits output from the turbo decoder, whereas in the second embodiment, the signals output from the BCJR decoders 1001 and 1003 are the LLR values of codeword bits output from the turbo decoder.

A signal output from the additional parity bit decoder 1009 should be provided to all information bits (or all codeword bits) used for generating the additional parity bits. Accordingly, if the number of bits used in XOR operation is 3, the additional parity bit decoder 1009 outputs three signals, as illustrated in FIG. 10.

A decoding scheduling method for increasing a decoding convergence speed according to an embodiment of the present disclosure will be described below.

Figure 11:
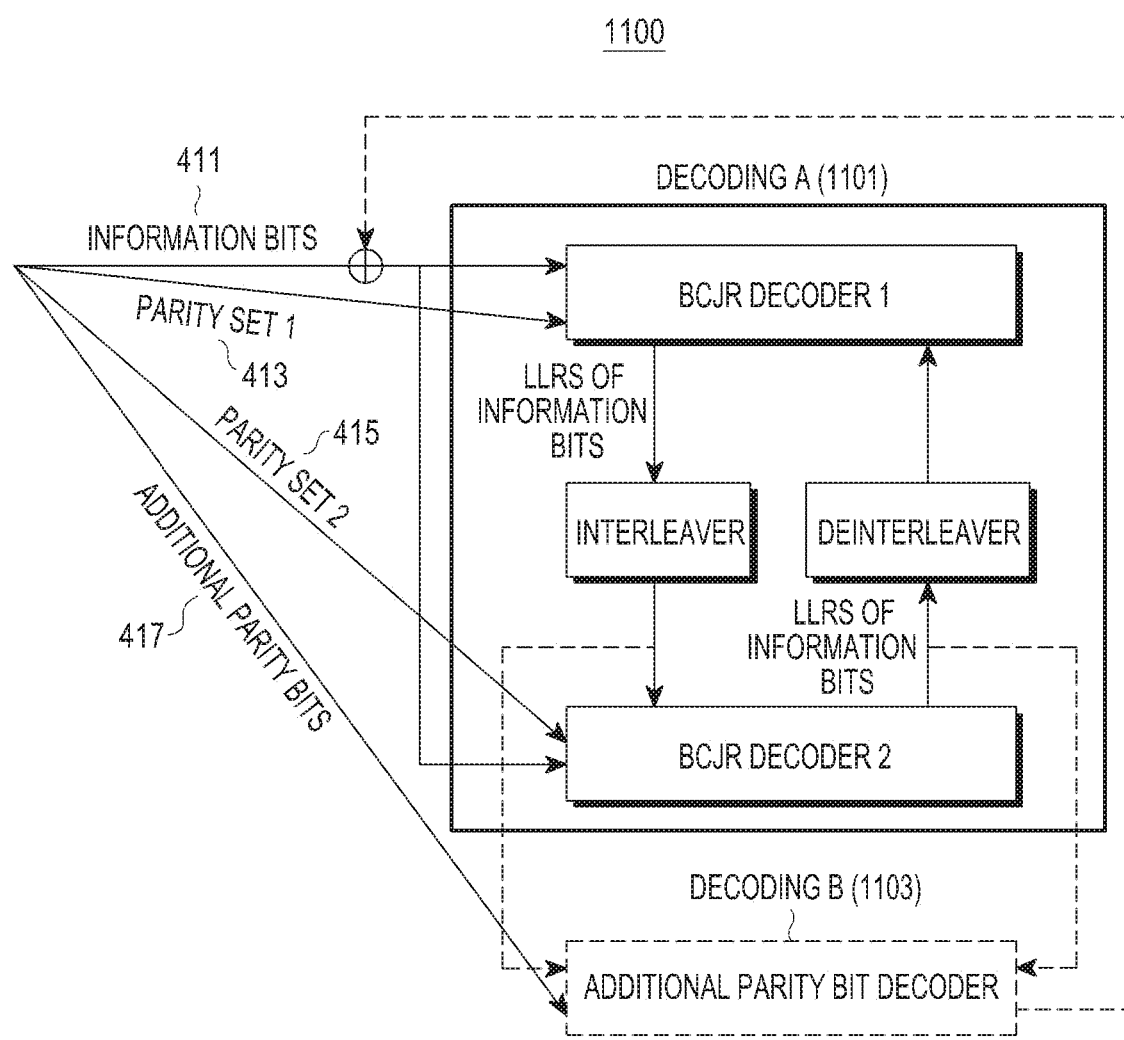
FIG. 11 is a view illustrating a decoding scheduling method according to an embodiment of the present disclosure.

FIG. 11 is a view illustrating a decoding scheduling method according to an embodiment of the present disclosure.

Referring to FIG. 11, a decoder 1100 is identical to the decoder 600 described before with reference to FIG. 6. The following description will be given of the decoding scheduling method in the context of the decoder 600 according to the foregoing first embodiment. However, the decoding scheduling scheme of the present disclosure is also applicable to the decoder 900 described with reference to FIG. 9.

The decoder 1100 proposed in the present disclosure is configured by adding the additional parity bit decoder 611 to the conventional turbo decoder. For the convenience of description, decoding performed in the conventional turbo decoder will be referred to as decoding A 1101, and decoding performed in the parity bit decoder 611 will be referred to as decoding B 1103. A decoding convergence speed and decoding performance may be increased by scheduling the number of occurrences of decoding A 1101 and the number of occurrences of decoding B 1103. The present disclosure proposes the following scheduling schemes.

(1) Scheduling scheme 1: Decoding B 1103 is performed x times (x≥1) each time decoding A 1101 is performed once in the conventional turbo decoder.

(2) Scheduling scheme 2: Decoding B 1103 is performed sufficiently n times before decoding A 1101 is performed once in the conventional turbo decoder.

(3) Scheduling scheme 3: Scheduling scheme 1 and scheduling scheme 2 are performed in combination.

Figure 12:
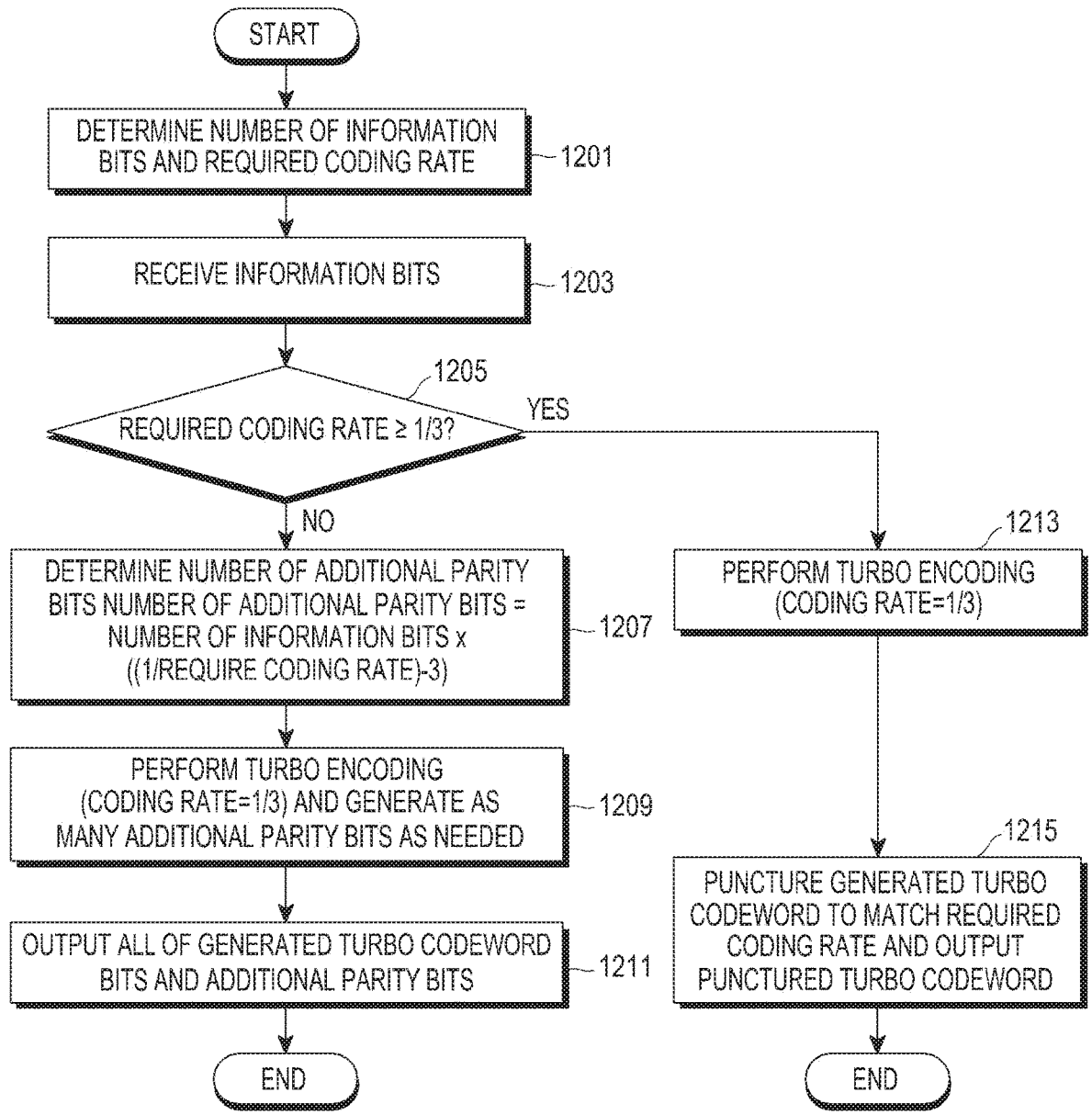
FIG. 12 is a flowchart illustrating an encoding operation according to an embodiment of the present disclosure.

FIG. 12 is a flowchart illustrating an encoding operation according to an embodiment of the present disclosure.

Referring to FIG. 12, the number of information bits and a required coding rate are determined in operation 1201. The determination may be made by, but not limited to, a base station (BS). In operation 1203, an encoder receives information bits according to the determined number of information bits and the required coding rate. It is determined whether the required coding rate is equal to or higher than a predetermined value (hereinafter, it is assumed to be ⅓) in operation 1205. If the required coding rate is equal to or higher than ⅓, the procedure goes to operation 1213.

In operations 1213 and 1215, encoding is performed in the conventional manner. That is, a codeword is generated by rate ⅓ turbo encoding in operation 1213, and the turbo codeword is punctured to match the required coding rate in operation 1215.

On the contrary, if the required coding rate is lower than ⅓ in operation 1205, encoding is performed in a method of the present disclosure in operation 1207. That is, the number of necessary additional parity bits is determined. The number of additional parity bits may be determined to be {number of information bits*(1/required coding rate−3)}. Subsequently, encoding is performed at the coding rate of ⅓ and the determined number of parity bits are generated in operation 1209. In operation 1211, the bits of the generated turbo codeword and the generated additional parity bits are all output.

Figure 13:
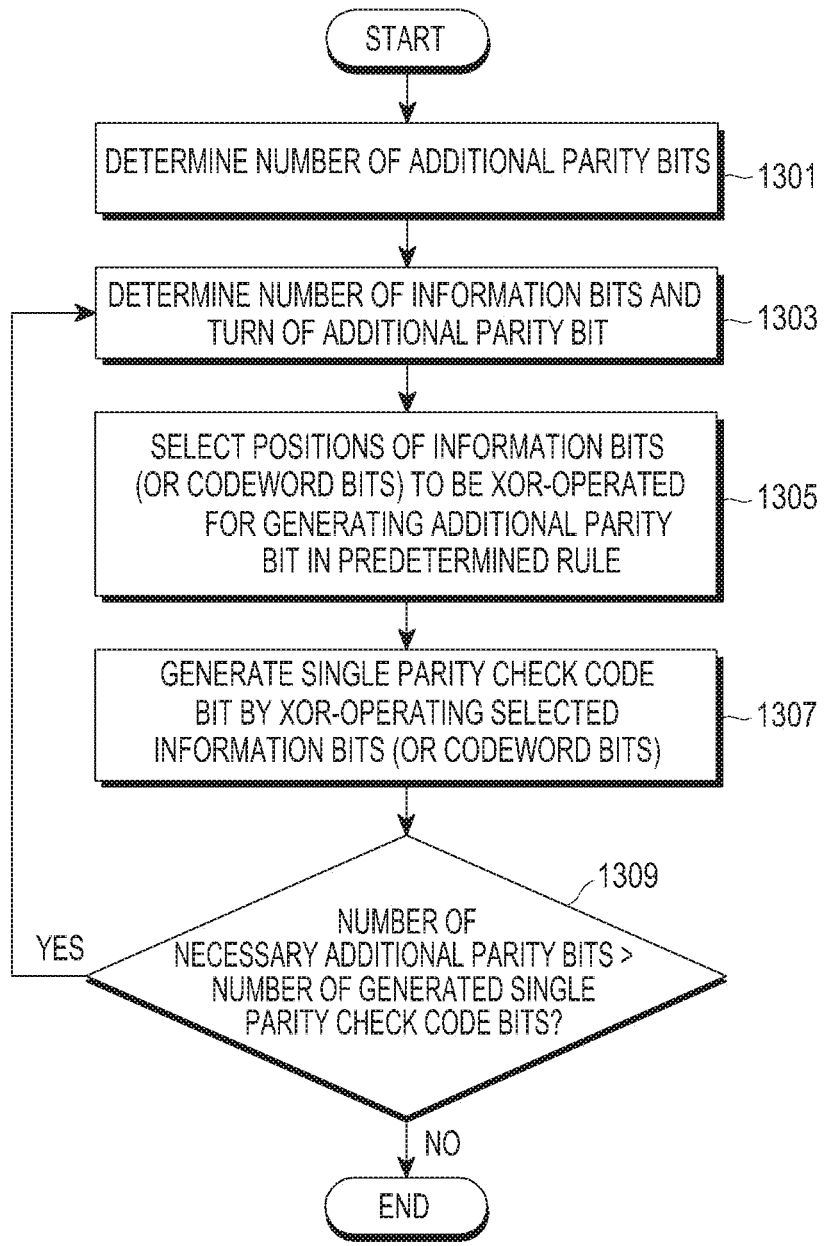
FIG. 13 is a flowchart illustrating an operation for generating additional parity bits according to an embodiment of the present disclosure.

FIG. 13 is a flowchart illustrating an operation for generating additional parity bits according to an embodiment of the present disclosure.

Referring to FIG. 13, the number of necessary additional parity bits is determined in operation 1301, and in operation 1305 the positions of information bits (or codeword bits) are selected in a predetermined rule according to the determined number of additional parity bits and the turn of an additional parity bit in operation 1303. In operation 1307, the additional parity bit is generated by XOR-operating information bits (or codeword bits) at the selected positions. As described before, additional parity bits may be generated using a single parity check code. It is determined whether the number of necessary additional parity bits is larger than the number of generated additional parity bits in operation 1309. If the number of necessary additional parity bits is not larger than the number of generated additional parity bits, the procedure returns to operation 1303 and the aforedescribed operations are repeated until as many additional parity bits as the required number are generated.

Now, a description will be given of a method for determining the number and positions of information bits (or codeword bits) for use in generating additional parity bits according to various embodiments of the present disclosure. Unless otherwise specified, the term "bit" means an information bit or a codeword bit.

To satisfy various numbers of information bits required for cellular communication, channel encoding should support various numbers of information bits. Accordingly, the number and positions of bits to be used in configuring additional parity bits should be predetermined for each possible number of bits and each possible required coding rate, and the determined numbers and positions of bits should be shared between a transmitter and a receiver. The present disclosure proposes the following two methods for determining the number and positions of bits.

(1) Method 1: The positions of bits to be used for generating an additional parity bit are determined as a function of the number of bits. This method is referred to as a "systematic" method.

(2) Method 2: The positions of bits to be used for generating an additional parity bit are determined randomly in a predetermined rule. This method is referred to as a "random" method.

Figure 14:
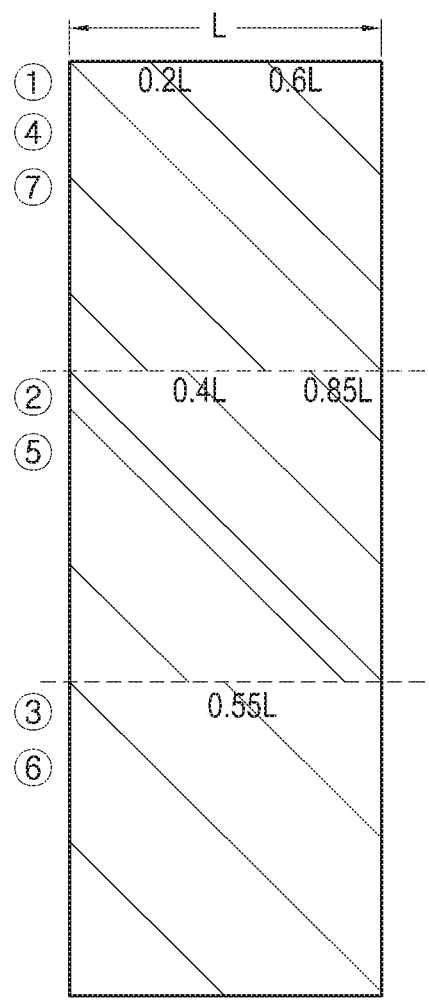
FIG. 14 is a view illustrating a method for determining the positions of information bits for use in generating additional parity bits according to an embodiment of the present disclosure.

FIG. 14 is a view illustrating a method for determining the positions of information bits for use in generating an additional parity according to an embodiment of the present disclosure.

Referring to FIG. 14, it is assumed that a required coding rate is ⅙ and the number of required additional parity bits is 7. On this assumption, the positions of information bits needed to generate 7 additional parity bits are determined in the systematic method, by way of example. Referring to FIG. 14, reference character "L" denotes the number of information bits, and reference numbers ①, ②, . . . , ⑦ . . . denote the order of generated additional parity bits.

In the example of FIG. 14, the positions of bits to be XOR-operated for generation of each additional parity bit may be determined to be positions on each slanting line drawn in a matrix according to the turn of each additional parity bit. In this method, an additional parity generation method satisfying a required coding rate between ⅓ and ⅙ may be expressed as the following Equation 2.

$$(0,\lfloor 0.2\ L\rfloor,\lfloor 0.6\ L\rfloor),(0,\lfloor 0.4\ L\rfloor,\lfloor 0.85\ L\rfloor),(0,\lfloor 0.55\ L\rfloor) \qquad \text{Equation 2}$$

Equation 2 indicates that a case of three bits used for XOR operation at a coding rate between ⅓ and ⅙ occupies a proportion of 66.6% and a case of two bits used for XOR operation at a coding rate between ⅓ and ⅙ occupies a proportion of 33.3%, and also provides information about the positions of bits used for XOR operation for each additional parity bit.

According to this method, the number and positions of bits used for generating each additional parity bit may be expressed for an arbitrary L value. Meanwhile, the transmitter and the receiver share simple information such as Equation 2 in advance. The receiver may acquire information about the method for generating additional parity bits in an encoder of the transmitter based on the shared information.

Meanwhile, if Method 2, that is, the random method is used, the transmitter and the receiver may share a random seed and determine the positions of bits randomly, using the random seed. However, because the number of bits used for XOR operation affects performance significantly in the additional parity generation methods proposed by the present disclosure, bits should be selected for XOR operation, satisfying the following two criteria, even in the random method.

(1) Criterion 1: a predetermined value as the number of bits used to generate each additional parity bit.

(2) Criterion 2: a predetermined value as the number of uses of each bit in generating additional parity bits.

The predetermined values given as Criterion 1 and Criterion 2 may be values which have been simulated statistically as leading to high efficiency. Meanwhile, the statistical simulation results may be laid out as a table listing values of Criterion 1 and Criterion 2 for coding rates, and values of Criterion 1 and Criterion 2 for each coding rate may be used, referring to the table. Meanwhile, although a single value may be given as a value of Criterion 1 or Criterion 2, a range of values may be given for Criterion 1 or Criterion 2. For example, for a coding rate of ⅙, the number of bits used for generating an additional parity bit may be set to 1 to 3.

While the above embodiments of the present disclosure have been described in the context of a single parity check code used for generating additional parity bits, they are also applicable to an encoder and decoder using a channel code other than the single parity check code, such as an LDPC code, a Bose-Chaudhuri-Hocquenghem (BCH) code, and a Reed-Muller (RM) code.

Figure 15:
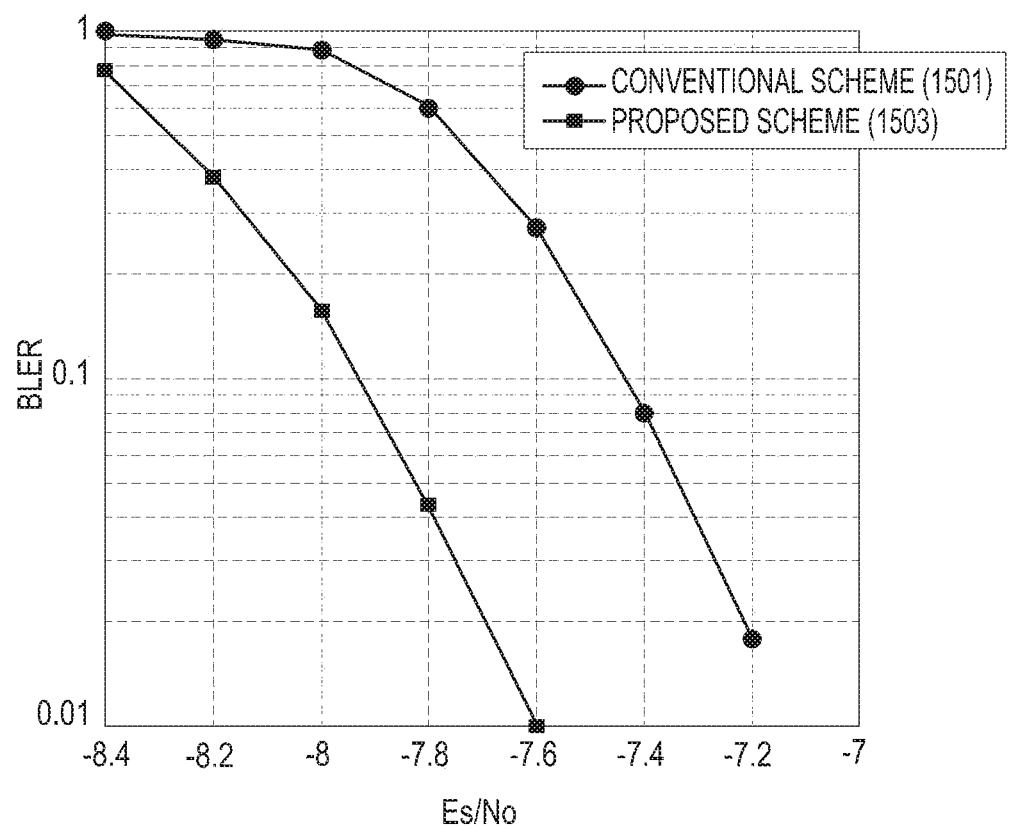
FIG. 15 is a graph illustrating the performance of generation of additional parity bits using a single parity check code according to an embodiment of the present disclosure.

FIG. 15 is a graph illustrating the performance of generation of additional parity bits using a single parity check code according to an embodiment of the present disclosure.

Referring to FIG. 15, reference numeral 1501 denotes the performance of a conventional rate ⅙ encoding scheme, and reference numeral 1503 denotes the performance of a rate ⅙ encoding scheme according to an embodiment of the present disclosure. A single parity check code is used for generation of additional parity bits in the rate ⅙ encoding scheme according to the embodiment of the present disclosure. It is noted that if there are 1024 information bits on an additive white Gaussian noise (AWGN) channel, the encoding scheme 1503 of the present disclosure has a performance gain of about 0.5 dB compared to the conventional encoding scheme 1501. Further, although the conventional encoding scheme 1501 has no coding gain at or below a coding rate of ⅓, the encoding scheme 1503 of the present disclosure has a performance gain compared to the conventional encoding scheme 1501.

The afore-described aspects of the present disclosure may be implemented as computer-readable code in a computer-readable recoding medium. The computer-readable recording medium may be any recording device that stores data readable by a computer system. Examples of the computer-readable recording medium include read only memory (ROM), random access memory (RAM), compact disk-ROM (CD-ROM), magnetic tape, floppy disk, optical data storage device, and carrier waves. In addition, the computer-readable recording medium may be distributed over computer systems connected over a network, and computer-readable codes may be stored and executed in a distributed manner. Also, programmers skilled in the art of the present disclosure may readily interpret functional programs, code, and code segments for implementing the present disclosure.

The method and apparatus according to an embodiment of the present disclosure may be implemented in hardware, software, or a combination of hardware and software. The software may be stored, for example, irrespective of erasable or rewritable, in a volatile or non-volatile storage device such as a storage device like ROM, a memory such as RAM, a memory chip, or an integrated circuit (IC), or an optically or magnetically writable and machine-readable (for example, computer-readable) storage medium such as CD, digital versatile disc (DVD), or magnetic tape. The method according to an embodiment of the present disclosure may be implemented by a computer or a portable terminal including a controller and a memory. The memory is an example of a machine-readable storage medium suitable for storing a program or programs including instructions that implement embodiments of the present disclosure.

Accordingly, the present disclosure includes a program including code for implementing the apparatus or method as disclosed in the claims and a machine-readable storage medium that stores the program. Also, this program may be electronically transferred through a medium such as a communication signal transmitted by wired or wireless connection and the present disclosure includes its equivalents appropriately.

An apparatus according to an embodiment of the present disclosure may receive a program from a wired or wirelessly connected program providing device and store the program. The program providing device may include a program having instructions for implementing a predetermined method for protecting content, a memory for storing information needed for the content protection method, a communication unit for conducting wired or wireless communication with a graphic processing device, and a controller for transmitting the program upon request of a transmitting and receiving apparatus or automatically.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A channel encoding method in a wireless communication system, the channel encoding method comprising:
generating, by an encoding device, a first parity set and a second parity set by turbo encoding information bits;
determining, by the encoding device, a number of additional parity bits based on a number of the information bits and a required coding rate;
determining, by the encoding device, at least two positions of the information bits to be used in generating each additional parity bit of the additional parity bits based on a predetermined value of the number of information bits and a predetermined value of a number of uses of each bit in generating additional parity bits;
generating, by the encoding device, each additional parity bit of the additional parity bits by performing a logical operation on at least two bits corresponding to the determined at least two positions of the information bits;
generating, by the encoding device, a codeword including the information bits, the first parity set, the second parity set, and the generated additional parity bits; and
transmitting, by the encoder device, the codeword to a decoding device,
wherein the generation of each additional parity bit of the additional parity bits comprises generating the additional parity bit by XOR-operating the information bits at the determined at least two positions,
wherein the generation of each additional parity bit of the additional parity bits is performed until the determined number of additional parity bits is reached, and
wherein the at least two positions of the information bits are randomly determined using a random seed.

2. The channel encoding method of claim 1, wherein the determination of the at least two positions of the information bits according to the predetermined value of the number of information bits comprises determining the at least two positions of the information bits by a function based on the predetermined value of the number of the information bits.

3. The channel encoding method of claim 1, wherein the generating of each additional parity bit of the additional parity bits is performed using one of a single parity check code, a low-density parity-check (LDPC) code, a Bose-Chaudhuri-Hocquenghem (BCH) code, or a Reed-Muller (RM) code.

4. A channel encoder in a wireless communication system, comprising:
- a first encoder configured to generate a first parity set and a second parity set by turbo encoding information bits;
- an additional parity bit generator configured to:
  - determine a number of additional parity bits based on a number of the information bits and a required coding rate,
  - determine at least two positions of the information bits to be used in generating each additional parity bit of the additional parity bits based on a predetermined value of the number of information bits and a predetermined value of a number of uses of each bit in generating additional parity bits, and
  - generate each additional parity bit of the additional parity bits by performing a logical operation on at least two bits corresponding to the determined at least two positions of the information bits;
- a codeword generator configured to generate a codeword including the information bits, the first parity set, the second parity set, and the generated additional parity bits; and
- a transceiver configured to transmit the codeword to a decoding device, wherein the additional parity bit generator is further configured to:
- generate the additional parity bit by XOR-operating the information bits at the determined at least two positions, and
- generate each additional parity bit of the additional parity bits until the additional parity bits is reached, and wherein the at least two positions of the information bits are determined randomly using a random seed.

5. The channel encoder of claim 4, wherein, to determine the at least two positions of the information bits according to the predetermined value of the number of information bits, the additional parity bit generator is configured to determine the at least two positions of the information bits by a function based on the predetermined value of the number of the information bits.

6. The channel encoder of claim 4, wherein the additional parity bit generator is further configured to generate the additional parity bits using one of a single parity check code, a low-density parity-check (LDPC) code, a Bose-Chaudhuri-Hocquenghem (BCH) code, or a Reed-Muller (RM) code.

* * * * *